United States Patent [19]

Alvité

[11] Patent Number: 5,469,332
[45] Date of Patent: Nov. 21, 1995

[54] PC CARD ASSEMBLY

[75] Inventor: Joseph Alvité, Wyoming, Minn.

[73] Assignee: Robodyne Corporation, Minneapolis, Minn.

[21] Appl. No.: 269,893

[22] Filed: Jul. 1, 1994

Related U.S. Application Data

[63] Continuation-in-part of Ser. No. 197,633, Feb. 17, 1994, abandoned.

[51] Int. Cl.⁶ ..................................................... H04K 1/14
[52] U.S. Cl. ........................ 361/737; 361/736; 361/741; 361/748; 439/60; 439/140
[58] Field of Search .................................. 361/728, 732, 361/736, 737, 740, 741, 747, 748, 810, 816; 439/60, 61, 59, 140; 174/260

[56] References Cited

U.S. PATENT DOCUMENTS

| | | | |
|---|---|---|---|
| 3,775,643 | 11/1973 | Schachnow et al. | 317/101 DH |
| 4,030,000 | 6/1977 | Stewart et al. | 361/400 |
| 4,548,448 | 10/1985 | Ellison et al. | 339/17 C |
| 4,789,347 | 12/1988 | Banjo et al. | 439/140 |
| 4,922,193 | 5/1990 | Bunata et al. | 324/158 R |
| 4,994,659 | 2/1991 | Yabe et al. | 235/492 |
| 5,086,336 | 2/1992 | Murasawa | 357/74 |
| 5,109,318 | 4/1992 | Funari et al. | 361/388 |
| 5,183,404 | 2/1993 | Aldous et al. | 439/55 |

OTHER PUBLICATIONS

R&D Micro Inc. PC Card brochure 2 pages.
AMP PC Card brochure, Frame Kits, Type II, Unshield, Nov. 1993 pp. 49–50.
PCMCIA PC Card Standard Release 2.0, pp. 3-1-3-26.
"Type II Memory Card Assembly Latch Covers" illustration (1 page).
"Memory Card Assembly Grounding Features" illustration (1 page).
"Type I Memory Card Assembly Adhesive Covers" illustration (1 page).
"Card Memory Device" illustration (1 page).
Globe Manufacturing Sales, Inc. PC Card brochure (1 page).
AMP PC Card brochure and customer drawing (2 pages).
Methode Electronics, Inc. PC Card ad and drawing (2 pages).
Duel Systems PC Card brochure (2 pages).
IBM 2.4/9.6 Data/Fax Modem ad, dated Nov. 1993 (1 page).

Primary Examiner—Leo P. Picard
Assistant Examiner—Young Whang
Attorney, Agent, or Firm—Faegre & Benson

[57] ABSTRACT

A PC card includes a board assembly enclosed by top and bottom covers. The board assembly includes a PC board with end housings on its opposite ends. A connector is mounted within one of the end housings and electrically interconnected to the PC board. Key-receiving slots extend through the opposite sides of the first and second end housings. Tracks on the opposite sides of the top and bottom covers form keyways extending between the key-receiving slots on the opposite sides of the board assembly. Elongated keys extend through the key-receiving slots of the end housings and through the keyways to secure the top and bottom covers to the board assembly. Releasable latches hold the keys within the keyways.

26 Claims, 11 Drawing Sheets

PC CARD ASSEMBLY

REFERENCE TO CO-PENDING APPLICATION

This application is a continuation-in-part of the commonly assigned Alvité U.S. patent application Ser. No. 08/197,633, filed Feb. 17, 1994, now abandoned on Jan. 24, 1995 and entitled PC Card Assembly.

BACKGROUND OF THE INVENTION

The present invention relates to PC memory cards of the type configured to be plugged into a computer system.

PC cards, also known as memory cards and IC cards, are in wide-spread use. These cards are credit card sized peripheral devices with electronic components that can add a wide variety of capabilities, such as memory, mass-storage, LAN, fax/modem and wireless communications to computers and other electronic systems. One or more electrical connectors on the sides of the card are used to connect the card to the electronic systems.

Known PC cards typically include one or more integrated circuits (ICs) or other electrical components mounted to a printed circuit (PC) board. At least one electrical connector is also mounted to the printed circuit board and electrically connected to the electrical components. The PC board is typically supported by a plastic frame. The frame, PC board, and connector are surrounded by a metallic cover; the cover encloses the frame and PC board, while the connectors project from openings in the ends of the cover. The cover typically comprises a top and bottom half, which are held together by a fastening means.

Commercially available PC cards employ various means for fastening the top and bottom covers to each other or to the plastic frame. PC cards manufactured by Elco and Methode have covers which include latches which engage the plastic frame, thus securing the covers to the frame. Duel Systems sells a PC card in which the top and bottom covers are ultrasonically welded together. A card manufactured by IBM uses laser welding to fasten the covers together. PC cards available from AMP, Globe Manufacturing, and Honda have a clamshell design in which a lip or lips on the top cover wrap around the edge of the bottom cover when the card is subjected to high pressure, thus clamping the covers together. The Honda card also uses an adhesive to more securely attach the covers. A similar card manufactured by R&D Micro is assembled by pressing the covers together around the plastic frame, but in this design the top and bottom covers both have lips which latch onto the frame.

Prior art PC card covers, once sealed, are generally not meant to be reopened and reused. However, it is sometimes desirable to replace electronic components within a PC card, such as when a battery runs down or when a card fails inspection before shipping. With the prior art PC card designs described above, reopening the card is difficult, and the cover and plastic frame are typically destroyed in the process. Thus, it is desirable to have a PC card which is inexpensive to manufacture and which may be readily reopened and resealed.

The Personal Computer Memory Card International Association (PCMCIA) is an industry group which sets standards for PC cards to ensure interoperability between the cards of different manufacturers. PCMCIA has set forth standards for three different sizes of cards known as Type I, Type II, and Type III cards. In general, however, the construction of PC cards is not governed by the PCMCIA standards. Many known PC card assemblies are relatively weak and can be easily damaged.

There remains a continuing need for improved PC card assemblies. The card must be sufficiently rigid to prevent damage caused by applied torque or bending forces. It is also desirable to be able to reopen the card for replacement of components and to be able to subsequently reseal the card. To be commercially viable, the card must also be capable of being efficiently and inexpensively manufactured.

SUMMARY OF THE INVENTION

The present invention is a rugged PC card that can be efficiently and relatively inexpensively manufactured. The card includes a board assembly enclosed by top and bottom covers. The board assembly includes a PC board having first and second opposite sides and first and second opposite ends. One or more electrical components is mounted to the PC board. A first end housing having opposite sides is mounted to the first end of the board and includes key-receiving slots on the opposite sides. A second end housing having opposite sides is mounted to the second end of the PC board and also includes key-receiving slots on the opposite sides. At least one of the end housings includes a connector electrically interconnected to the PC board. Tracks forming a keyway extend from the opposite sides of the PC board between the key-receiving slots on the first and second end housings. Elongated keys extend through the key-receiving slots and the keyway to secure the top and bottom covers to the board assembly. The keys are latched within the keyway by key latches. In one embodiment, the PC card includes releasable key latches. The card can thereby be easily disassembled to replace batteries or other electrical components, and reassembled.

DETAILED DESCRIPTION OF THE PREFERRED EMBODIMENTS

Figure 1:
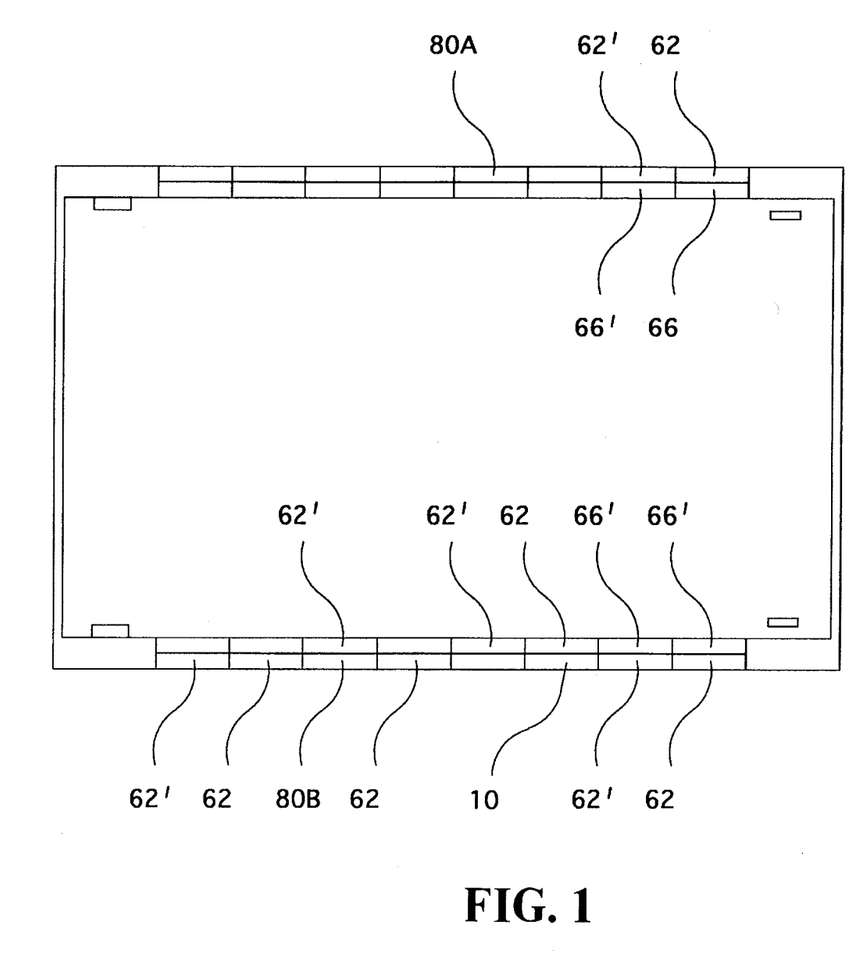
FIG. 1 is a top view of a first embodiment of a PC card in accordance with the present invention.
Figure 2:
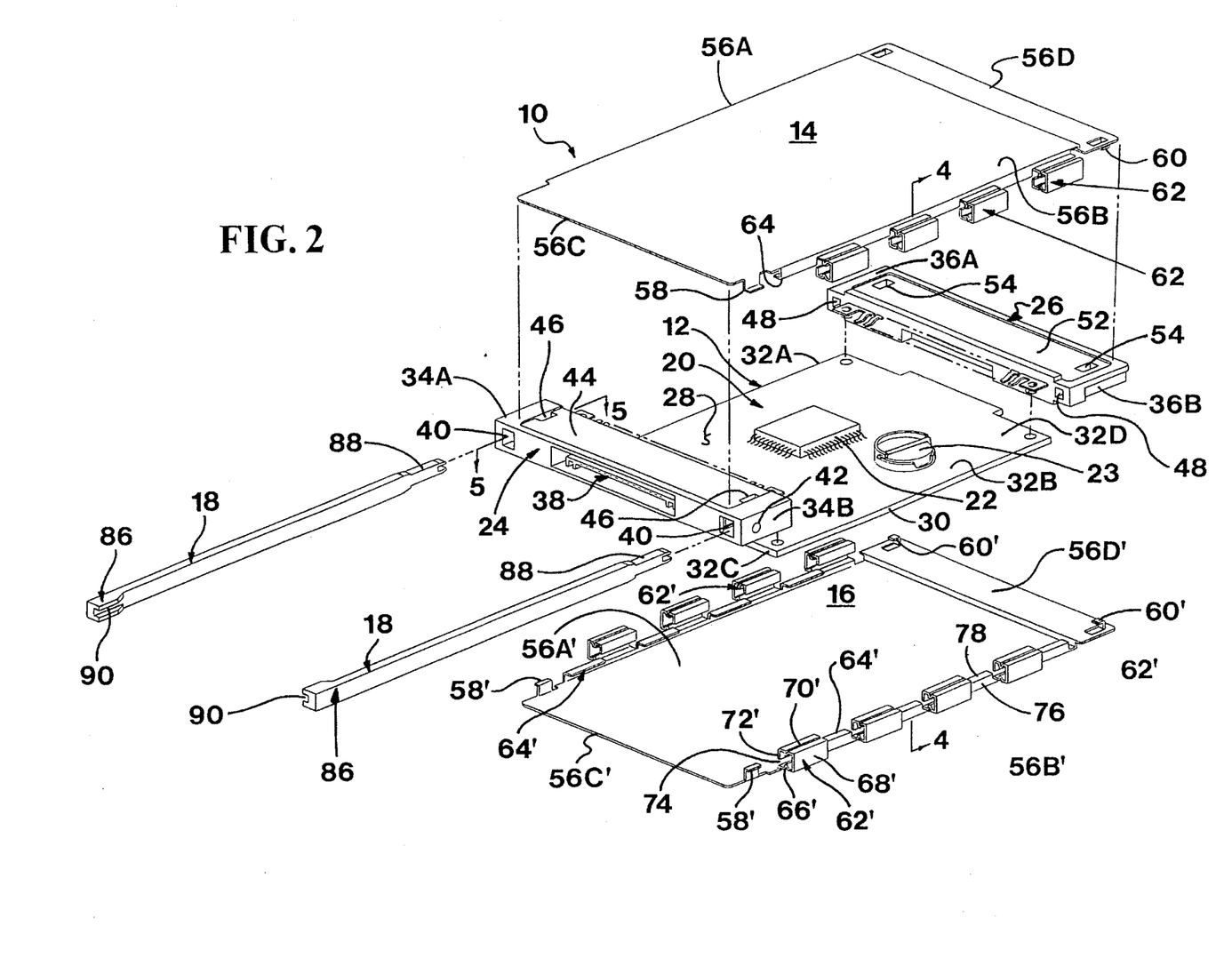
FIG. 2 is an exploded view of the disassembled PC card shown in FIG. 1.
Figure 3:
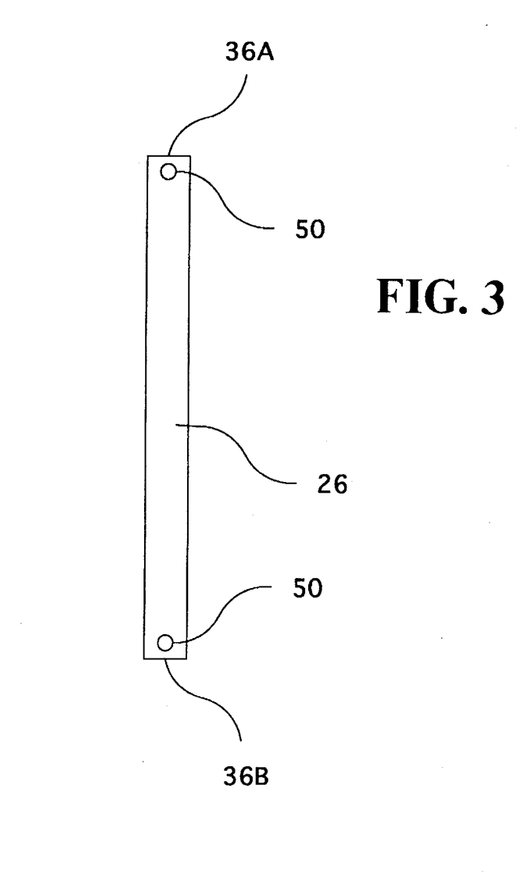
FIG. 3 is an end view of the PC card shown in FIG. 1, illustrating the end opposite that shown in FIG. 2.

A PC card 10 in accordance with the present invention is illustrated generally in FIGS. 1–3. As shown, PC card 10 includes a board assembly 12 enclosed by a top cover 14 and a bottom cover 16. Covers 14 and 16 are releasably secured to board assembly 12 by keys 18. PC card 10 can be configured in Type I, Type II and Type III Personal Computer Memory Card International Association (PCMCIA) formats. The modular design enables PC card 10 to be efficiently assembled and disassembled either manually or using automatic equipment. PC card 10 is also relatively stiff and therefore resistant to bending-induced damage.

Board assembly 12 includes a conventional PC (printed circuit) board 20, one or more electrical components such as IC (integrated circuit) 22 and battery 23, and first and second end housings 24 and 26. PC board 20 can be a single sided, double sided, multilayer, or other conventional board, and has a top surface 28, bottom surface 30, first and second opposite sides 32A and 32B, and first and second opposite ends 32C and 32D. IC 22 is shown mounted to top surface 28 of PC board 20, and includes leads (not shown) electrically interconnected to electrical conductors (not shown) on the PC board. Electrical components other than and in addition to IC 22 and battery 23 can also be mounted to PC board 20 as may be required for the particular application of the card (e.g. memory card, hard drive, flash card, LAN card, wireless communication, modem, etc.).

End housings 24 and 26 function as enclosures on the end of PC card 10, and are mounted by solder or other conventional methods to ends 32C and 32D respectively, of PC card 20. As perhaps best shown in FIG. 2, first end housing 24 has first and second opposite sides 34A and 34B which extend beyond sides 32A and 32B, respectively, of PC board 20. Similarly, second end housing 26 includes first and second opposite sides 36A and 36B which extend beyond sides 32A and 32B, respectively, of PC board 20. First end housing 24 is a polymer member which includes a standard multi-pin connector 38 on its end face. Key-receiving slots 40 are parallel to sides 32A and 32B of PC board 20, and extend through sides 34A and 34B of first end housing 24. Connector 38 is electrically interconnected to the electrical conductors on PC board 20 in a conventional manner. Latch release apertures 42 (only one of which is visible in FIG. 2) extend through the side walls of first end housing 24 into communication with slot 40. The top surface of first end housing 24 also includes a recess 44 which is sized to receive top cover 14. Cover-receiving apertures 46 extend into first end housing 24 in recess 44 near sides 34A and 34B, and as described below are sized to receive tabs on top cover 14. Although not visible in FIG. 2, the bottom of first end housing 24 also includes a recess and apertures substantially identical to recess 44 and apertures 46 described above.

Second end housing 26 is also a polymer member and includes key-receiving slots 48 in its opposite sides 36A and 36B. Key-receiving slots 48 are collinear with key-receiving slots 40 in first end housing 24. As shown in FIG. 3, key removal apertures 50 extend through the end face of the second end housing 26 and into communication with key-receiving slots 48. A recess 52 on the top surface of second end housing 26 is sized to receive the end of top cover 14. Apertures 54 extend into second end housing 26 near its opposite sides 36A and 36B, and are sized to receive tabs 60 of cover 14 in a manner described in greater detail below. Although not visible in FIG. 2, the bottom of second end housing 26 also includes a recess and cover-receiving apertures substantially identical to recess 52 and apertures 54 described immediately above.

Top cover 14 has first and second opposite sides 56A and 56B, and first and second opposite ends 56C and 56D, respectively. A pair of locking tabs 58 extend from the opposite sides 56A and 56B of cover 14 near first end 56C. Similarly, a pair of locking tabs 60 extend from sides 56A and 56B of cover 14 near end 56D. Cover 14 extends over and encloses upper surface 28 of PC board 20. First end 56C fits into recess 44 of first end housing 24, with locking tabs 58 engaged within recesses 46. Similarly, second end 56D fits into recess 52 of second end housing 26, and is secured into position by tabs 60 which are engaged with the second end housing 26 in apertures 54. Top cover 14 and bottom cover 16 are fabricated in a conventional manner from sheets of stainless steel or other conductive metal.

Figure 4:
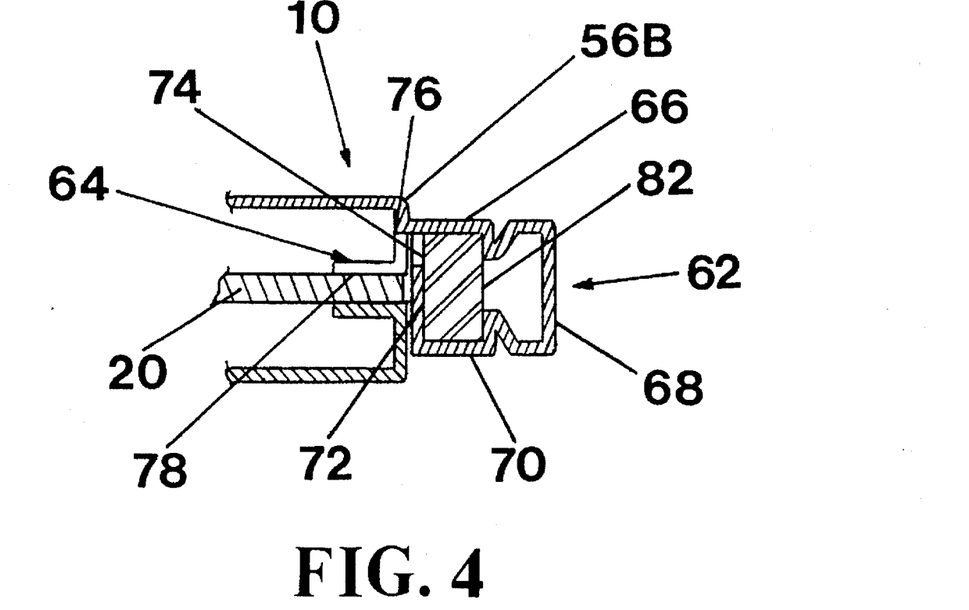
FIG. 4 is a detailed view of the assembled card taken along line 4—4 in FIG. 2, illustrating the keyway and keys.

A plurality (four are shown in FIGS. 1 and 2) of tracks or loops 62 extend from sides 56A and 56B of top cover 14. Loops 62 are equally spaced from one another in the embodiment shown. Shelves 64 extend from sides 56A and 56B of top cover 14 and between loops 62. As shown in greater detail in FIG. 4, loops 62 are generally rectangular in cross section and include an upper wall 66, side wall 68 and bottom wall 70. An inner wall 72 extends upwardly from the inner most edge of bottom wall 70, forming a gap 74 which opens into loops 62 from the side opposite side wall 68. Shelves 64 are "L"-shaped members including a downwardly extending support wall 76 and an inwardly extending shelf wall 78. Shelf walls 78 are positioned to engage and support top surface 28 of PC board 20. Some of shelf walls 78 engage ground plane conductors (not shown) on PC board 20 to provide an integrated ground contact.

Bottom cover 16 is substantially structurally and functionally identical to top cover 14. Accordingly, elements of bottom cover 16 which correspond to those of top cover 14 are identified by identical but primed reference numerals (e.g., "x'") as those used to described top cover 14. The only difference between bottom cover 16 and top cover 14 is that the bottom cover includes loops 62' at locations corresponding to the locations of shelves 64 on the top cover. Similarly, bottom cover 16 includes shelves 64' at locations corresponding to the locations of loops 62 on top cover 14. When bottom cover 16 is mounted to the bottom side of board assembly 12, loops 62' are positioned in a complimentary relationship with respect to loops 62, and are interleaved to form continuous side walls 80A and 80B between end housings 24 and 26 along the opposite sides 32A and 32B, respectively, of board assembly 20. The interleaved nature of loops 62 and 62' produces elongated keyways 82 which extend between key-receiving slots 40 and 48 on the opposite sides 32A and 32B of board assembly 12.

Figure 5:
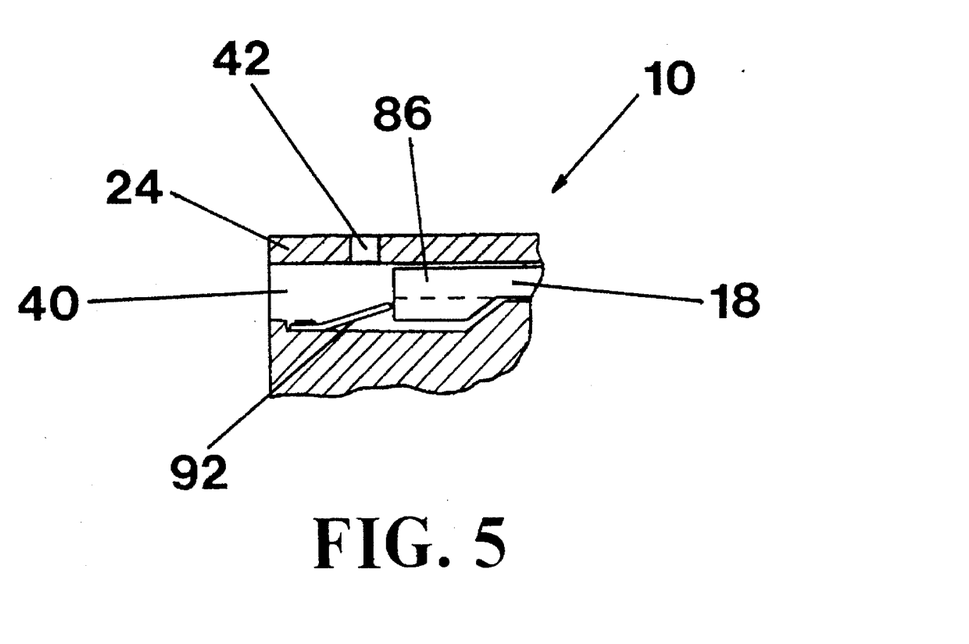
FIG. 5 is a detailed view of the assembled card taken along line 5—5 in FIG. 2, illustrating the key releasably retained by the latch.

Keys 18 are elongated metal or polymer members having first ends 86 and second ends 88. First ends 86 are enlarged and include guide slots 90 which extend generally parallel to the longitudinal orientation of keys 18. Keys 18 are inserted into slots 40 and pushed through first end housing 24, through keyways 82 formed by interleaved loops 62 and 62' of covers 14 and 16, respectively, and into key receiving slots 48 of second end housing 26. As shown in FIG. 5, resilient metal clips 92 are mounted within key-receiving slots 40 of first end housing 24 (only one side of housing 24 is shown in FIG. 5). Clips 92 include a member which slopes toward second end housing 26. As keys 18 are inserted into slot 40, the keys pass over clip 92. When keys 18 have been inserted all the way through keyway 82 and into second end housing 26, the enlarged first ends 86 will pass clip 92. Clips 92 are then biased outwardly to latch the keys 18 into keyway 82 and prevent the keys from sliding out of PC card 10.

When it is desired to disassemble PC card 10, pins (not shown) can be inserted into apertures 42 to force clips 92 to a position aligned with slots 90 in the ends of keys 18 to release the keys. Other pins (not shown) inserted into apertures 50 in second end housing 26 can then be used to push keys 18 out of first end housing 24. Keys 18 can then be withdrawn and covers 14 and 16 removed from board assembly 20.

Figure 6:
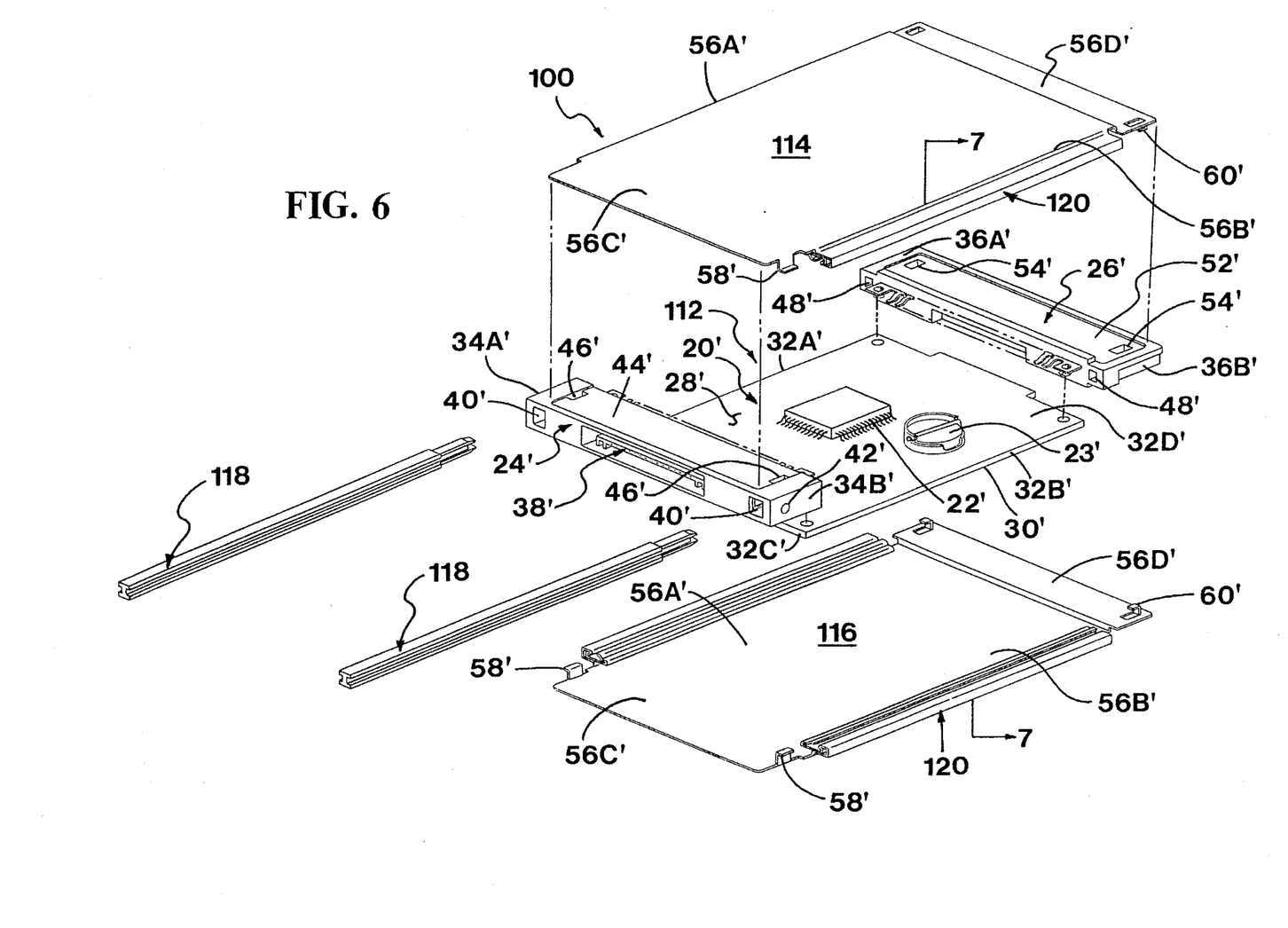
FIG. 6 is an exploded view of a second embodiment of a PC card in accordance with the present invention.

PC card 100, a second embodiment of the present invention, is illustrated in disassembled and exploded form in FIG. 6. As shown, PC card 100 includes a board assembly 112, top cover 114 and bottom cover 116. Covers 114 and 116 are releasably secured to board assembly 112 by keys 118. Board assembly 112 can be identical to board assembly 12 described above with reference to FIG. 3, and common features are identified in FIG. 6 by identical but primed reference numbers. With the exception of the tracks 120 on the sides of covers 114 and 116, the covers can be identical to one another and to covers 14 and 16 described above with reference to FIG. 3. Features of covers 114 and 116 that are common to those of cover 14 are identified in FIG. 6 with identical but primed reference numbers.

Figure 7:
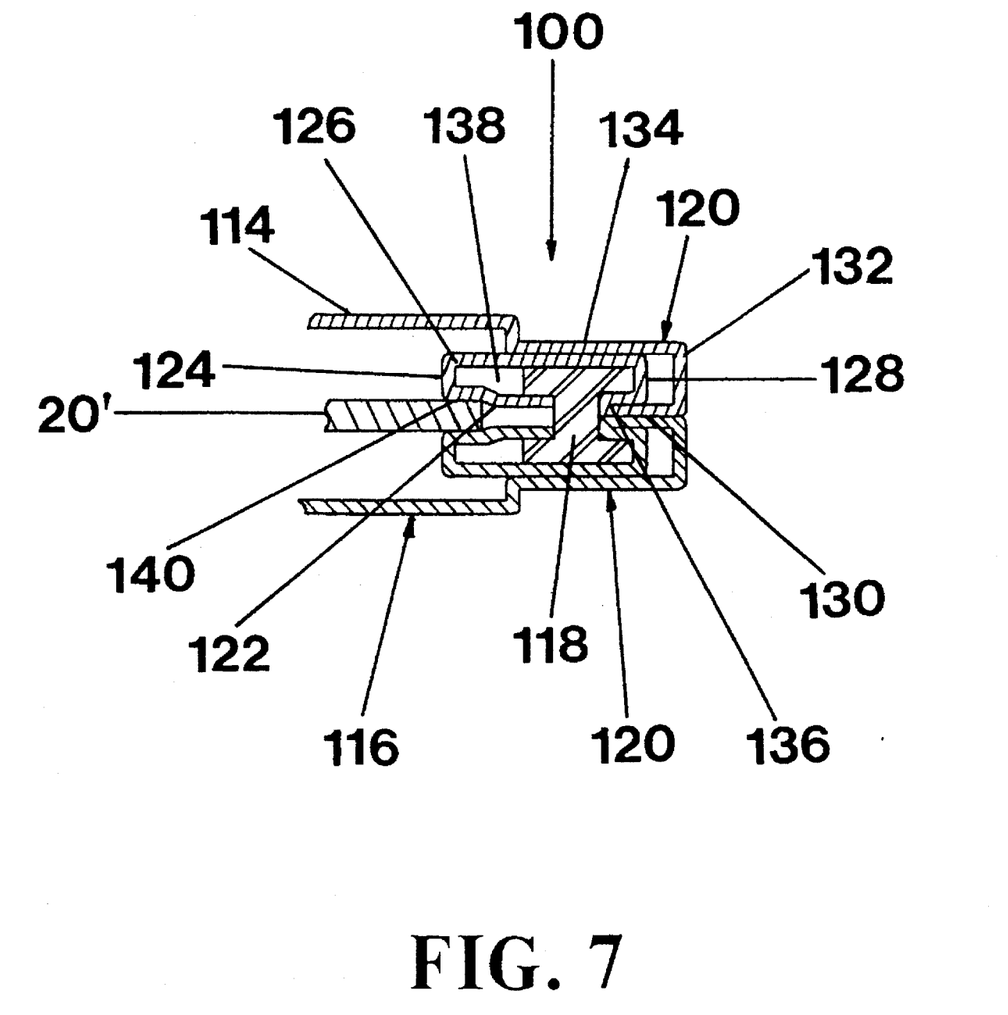
FIG. 7 is a detailed view of the assembled card taken along line 7—7 in FIG. 6, illustrating the keyway and key.
Figure 8:
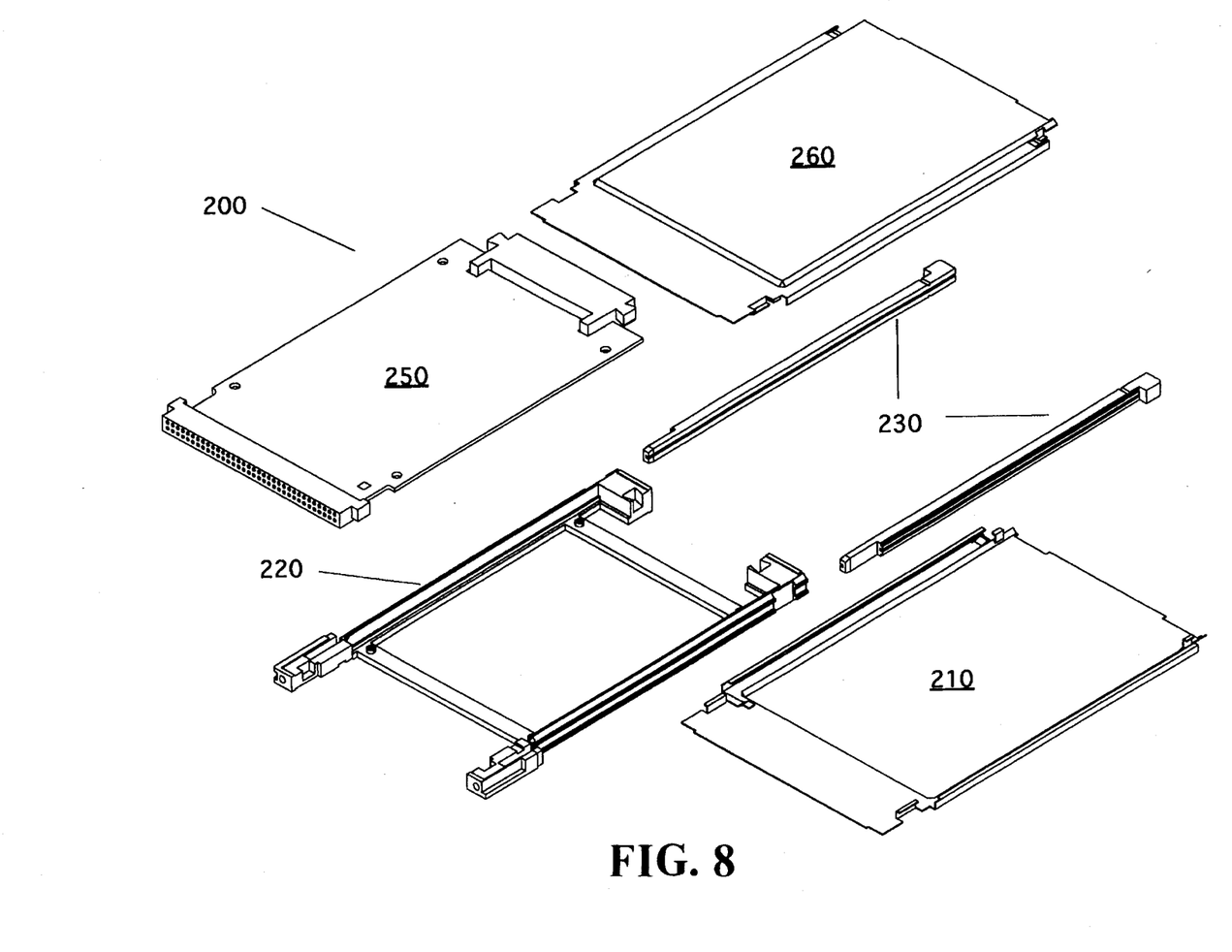
FIG. 8 is a view of a disassembled PC card in accordance with a third embodiment of the present invention.

Covers 114 and 116 include elongated tracks 120 extending between ends 56C' and 56D' on opposite sides 56A' and 56B'. Tracks 120 are fabricated by bending metal extending from the sides 56A' and 56B' of covers 114 and 116 into a "T" shaped channel. As shown in FIGS. 6 and 7, tracks 120 include wall sections 122, 124, 126, 128, 130, 132 and 134 which form a gap 136 opening into channel 138. Wall section 122 includes a recessed shelf area 140. When covers 114 and 116 are positioned over circuit board 20, shelf areas 140 of tracks 120 engage sides 32A' and 32B' of the circuit board, and tracks 120 form an elongated "H" shaped keyway. "H" shaped keys 118 are inserted into and retained within the keyways in a manner similar to that of keys 18 of PC card 10, to releasably secure covers 114 and 116 to board assembly 112.

Another embodiment of the present invention, PC card 200, can be described with referenced to FIGS. 8–13. In this embodiment, a frame support structure is used, while the advantages of a key-sealed PC card according to the invention are retained. This embodiment is illustrated generally in FIG. 8. PC card 200 includes a bottom cover 210, a plastic frame 220, keys 230, a PC board 250, and a top cover 260.

Figure 9:
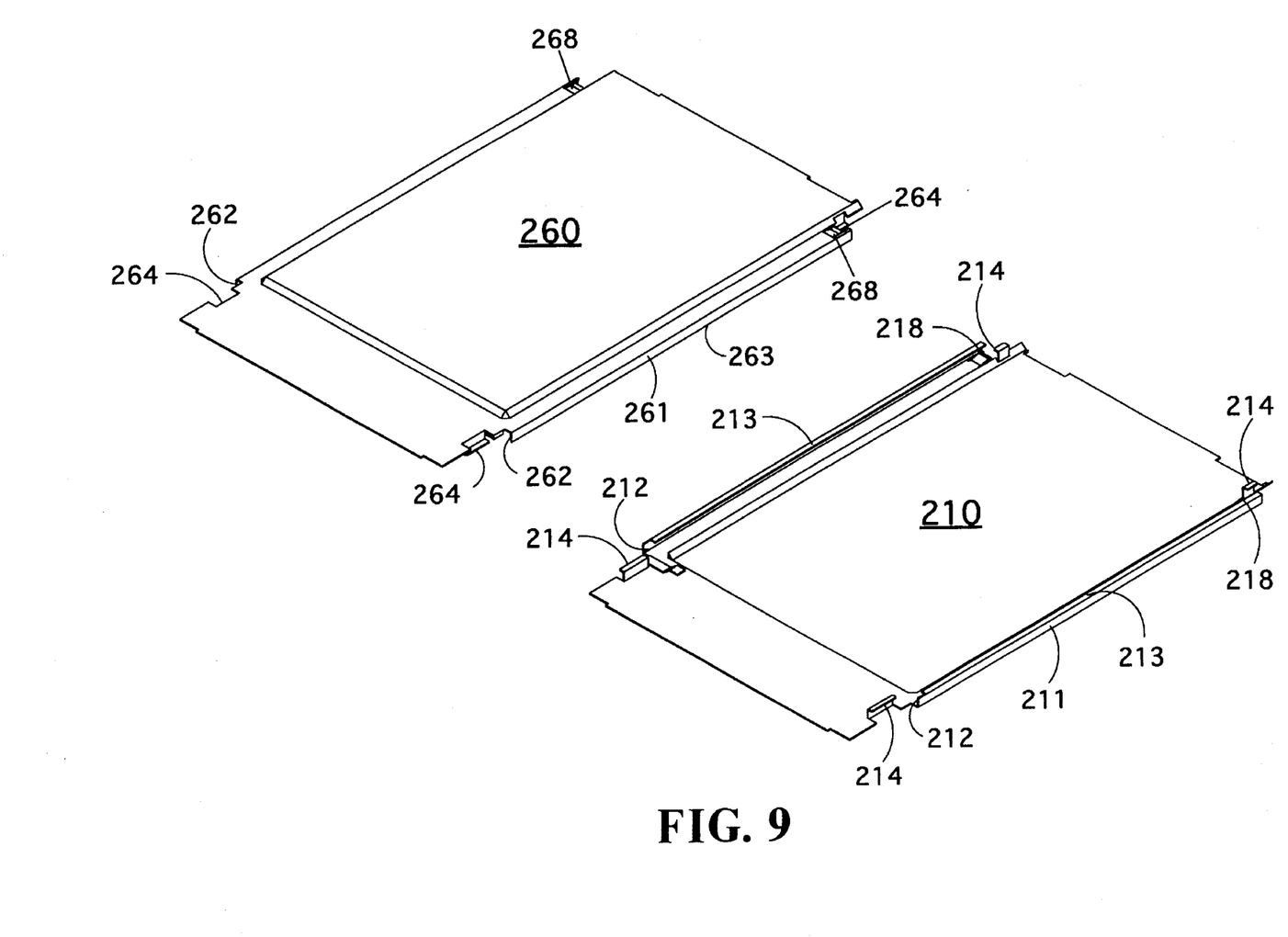
FIG. 9 is a detailed view of the top and bottom covers shown in FIG. 8.

Referring to FIG. 9, covers 210 and 260 are similar to covers 114 and 116 described above. Tracks 212 of cover 210 are "L"-shaped members formed by side walls 211 and inwardly extending lips 213. Similarly, tracks 262 of cover 260 are "L"-shaped members formed by side walls 261 and inwardly extending lips 263. When covers 210 and 260 are assembled on frame 220 as shown in FIG. 13, tracks 212 and 262 form keyways 270. Lips 213 and 263 engage one another to form interior ridges in keyways 270. Locking tabs 214 and 264 engage one another to form opposing interior ridges in keyways 270. Spring retainers 218 and 268 serve to releasably retain keys 230 within the keyways 270. Grounding pads 215 and 265 electrically interconnect with ground pads (shown in FIG. 12) PC board 250 to provide ground contact to the covers 210 and 260.

Figure 10:
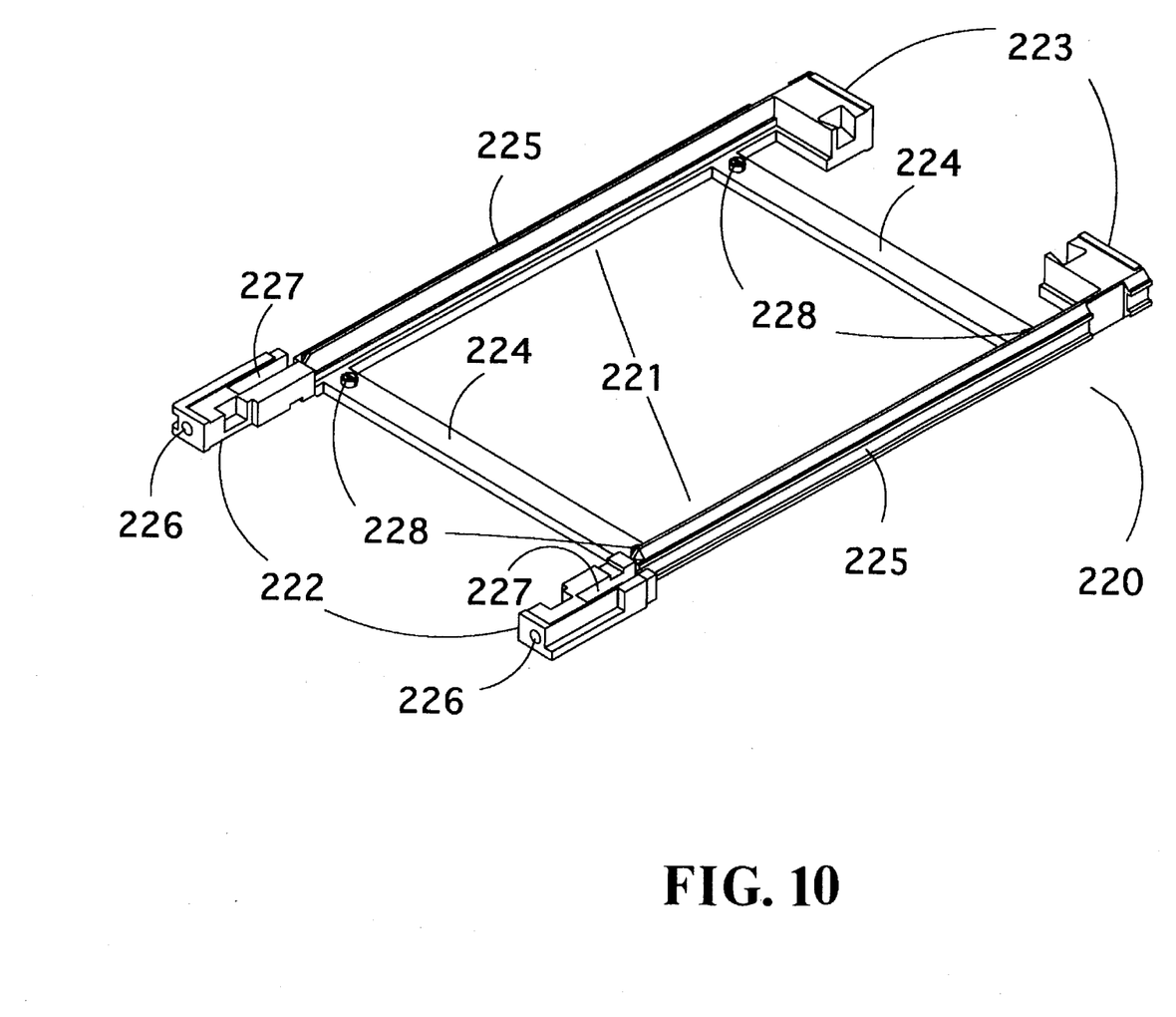
FIG. 10 is a detailed view of the frame shown in FIG. 8.

Referring to FIG. 10, frame 220 includes elongated side members 221 with front end members 222 and rear end members 223, and cross members 224 perpendicular to and extending between the side members. Side members 221 have slots 225 along the exterior side surfaces to form the interior walls of the keyways 270 as illustrated in FIG. 13. The front end members 222 have cavities 227 which receive locking tabs 214 and 264 on covers 210 and 260 in such a manner that the tabs form interior ridges in the keyways 270.

Apertures 226 in the front end members 222 provide access to the keyways 270 so that the keys 230, once inserted, may be pushed out of the keyways 270 by means of a push pin, paper clip, or other narrow device inserted through apertures 226. The cross pieces 224 have a plurality of split collars 228 which function to attach the PC board 250 to the frame.

Figure 11:
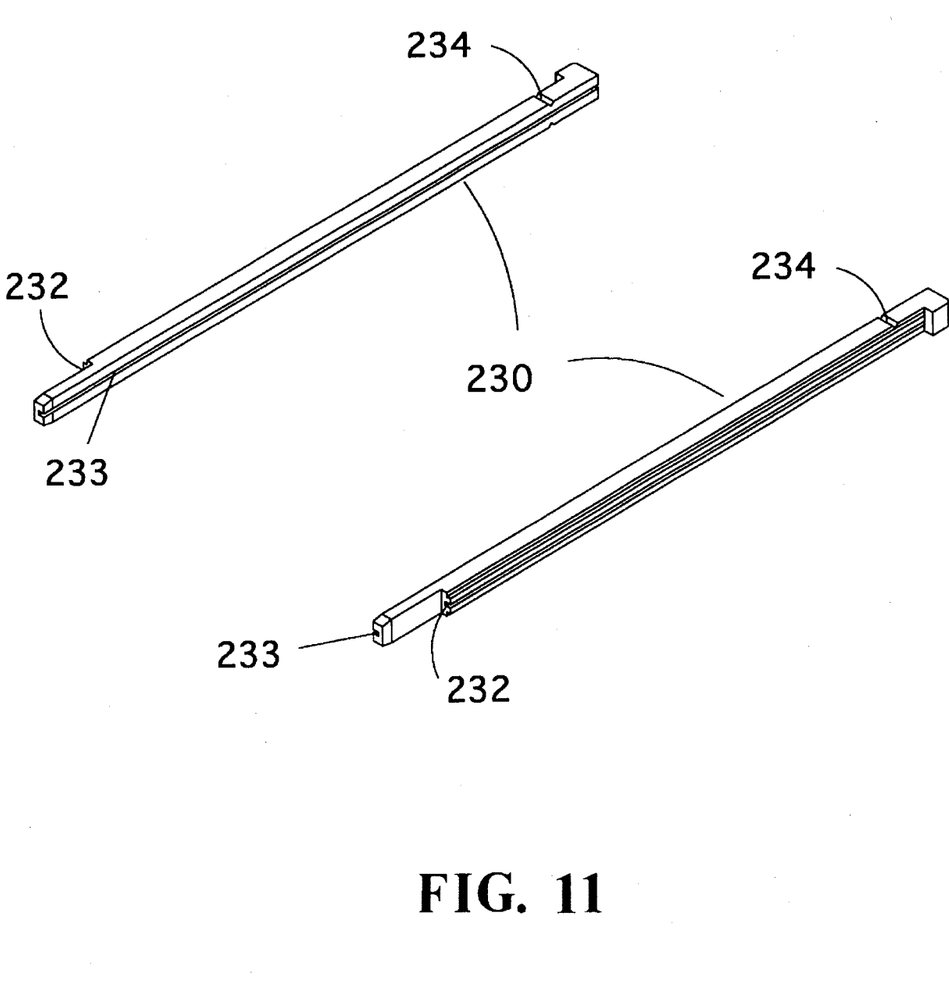
FIG. 11 is a detailed view of the keys shown in FIG. 8.

Referring to FIG. 11, keys 230 have longitudinally extending exterior grooves 232 which engage lips 213 and 263 on covers and 260, and longitudinally extending interior grooves 233 which engage tabs 214 and 264, both grooves acting to secure the ends of the covers into place on frame 220. Notches 234 engage releasable spring retainers 218 and 268 on covers 210 and 260 (shown in FIG. 9), thus releasably securing keys 230 in place upon insertion in the keyways 270.

Figure 12:
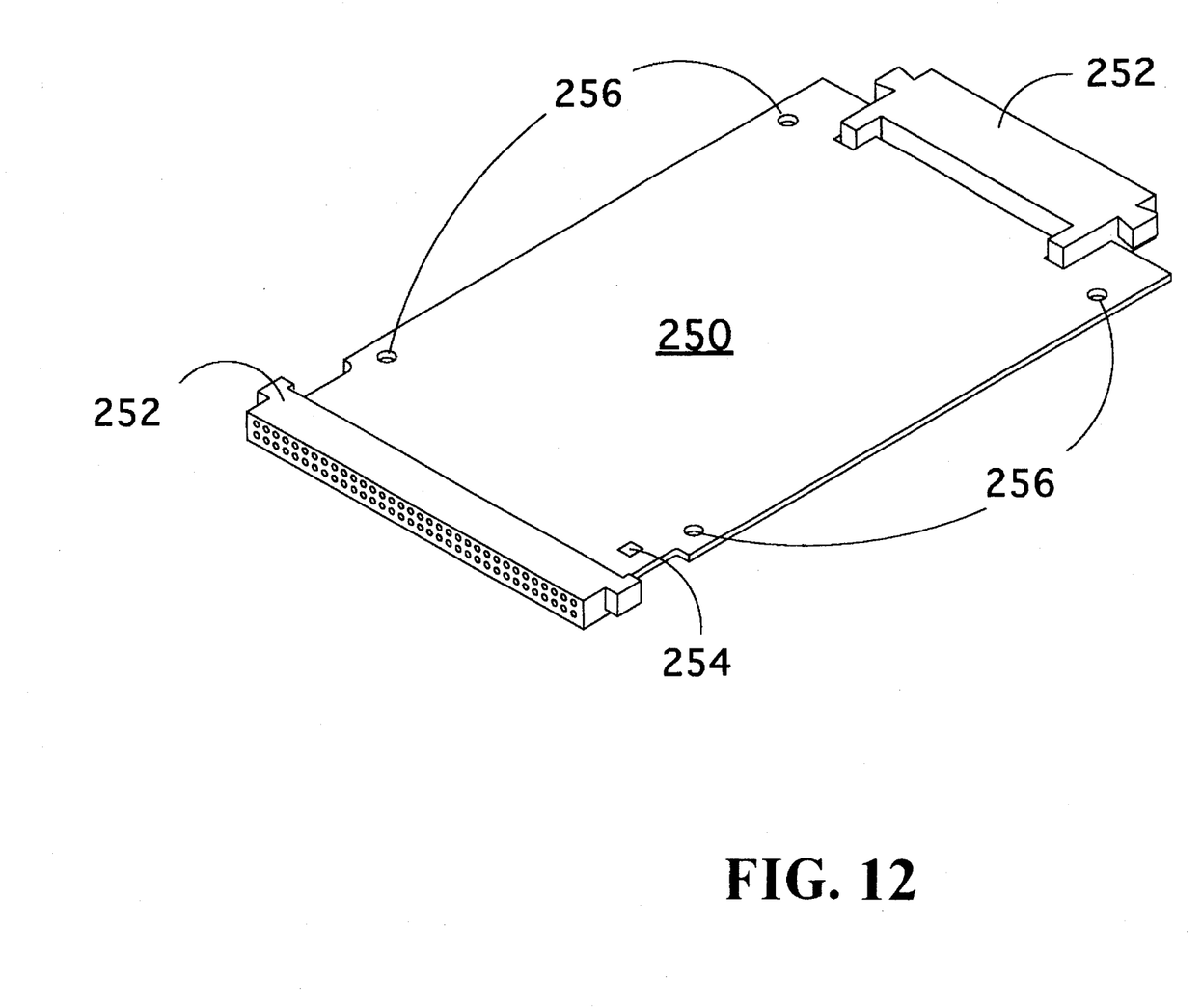
FIG. 12 is a detailed view of the PC board shown in FIG. 8.
Figure 13:
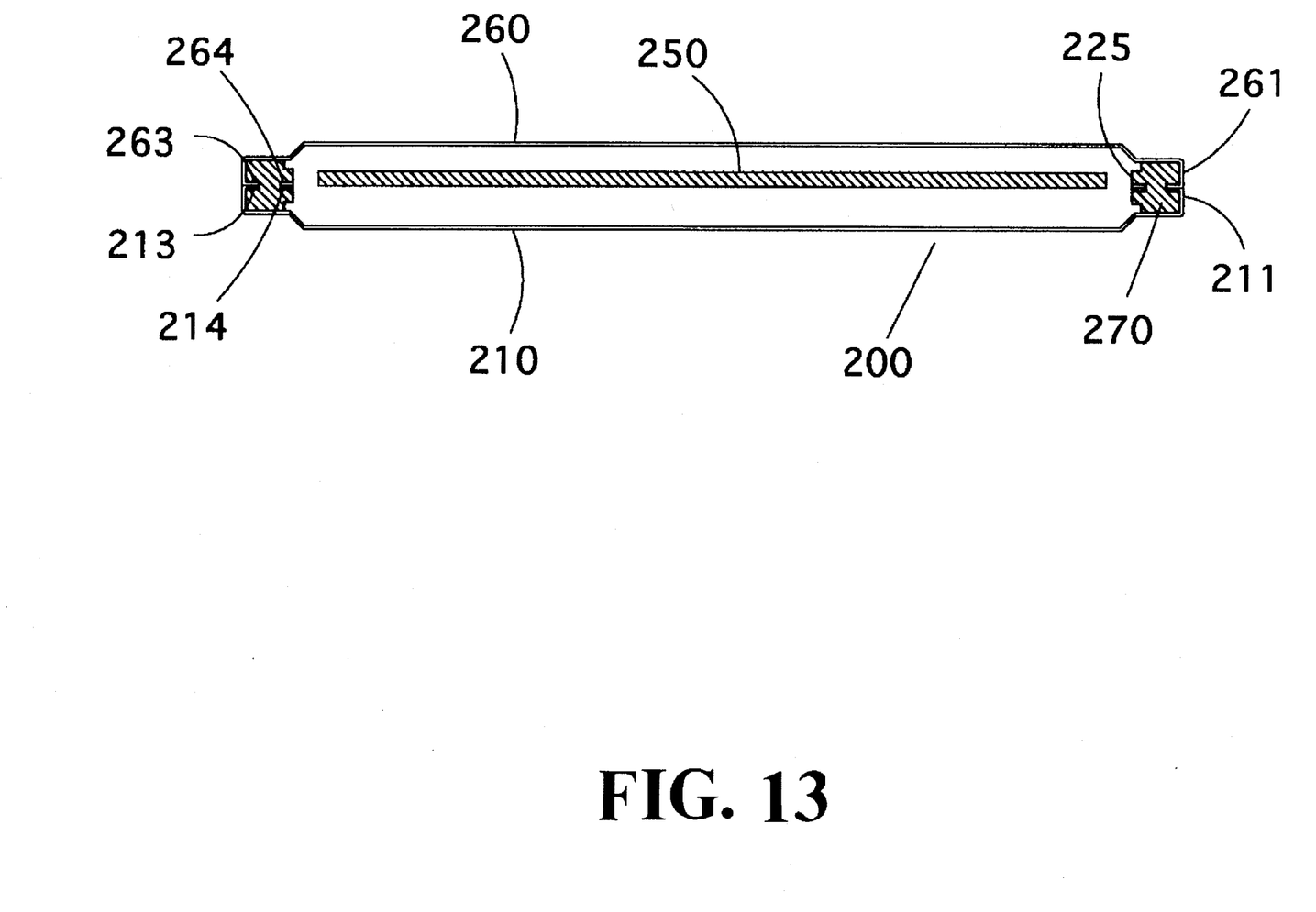
FIG. 13 is cross section view of the assembled PC card in accordance with the third embodiment.

PC board 250 is illustrated generally in FIG. 12. One or more electrical components (not shown) are secured to the board 250 and are electrically connected to connectors 252. The connectors allow communication between the board 250 and other electronic devices (not shown), such as a personal computer. Grounding pads 254 contact grounding pads 215 and 265 on covers 210 and 260 to provide electrical grounding to the covers. Cavities 256 engage split collars 228 on the frame 220, to secure the board 250 to the frame.

An assembled PC card 200 is illustrated in FIG. 13. In assembling the PC card 200, the PC board 250 is first mounted on the frame 220. The covers 210 and 260 are then pressed lightly together around the frame 220, thus forming the "C"-shaped keyways 270 (except for the portion of the keyways adjacent tabs 214 and 264 what are "H"-shaped. The keys 230 are then inserted into the keyways 270. When the keys 230 are fully inserted, spring retainers 218 and 268 snap into notches 234, locking the keys in place. To disassemble, a push pin, paper clip, or other device is inserted into apertures 226 to push the keys 230 out of their locked position in the keyways 270.

PC cards in accordance with the present invention offer considerable advantages over those of the prior art. The cards have few components and can be efficiently and relatively inexpensively manufactured. The design provides considerable interior space for components. They are suitable for manual or automatic assembly, yet can be disassembled for electrical component replacement or repair. The cards are fully shielded and include an integrated ground contact. They are also rigid and resistant to torque-induced damage. Any desired type of I/O connector can be included in the card. Ground capability is also independent of torque applied to the card.

Although the present invention has been described with reference to preferred embodiments, those skilled in the art will recognize that changes may be made in form and detail without departing from the spirit and scope of the invention.

What is claimed is:

1. A PC card, comprising:
   a board assembly, including:
      a PC board having first and second opposite sides and first and second opposite ends;
      one or more electrical components mounted to the PC board;
      a first end housing having opposite sides, the first end housing mounted to the first end of the PC board and including key-receiving slots on the opposite sides;
      a second end housing having opposite sides, the second end housing mounted to the second end of the PC board and including key-receiving slots on the opposite sides; and a connector in at least one of the first and second end housings electrically interconnected to the PC board;

top and bottom covers having first and second opposite sides, the top and bottom covers extending over the PC board between the first and second end housings, and including tracks forming a keyway extending along the opposite sides of the PC board between the key-receiving slots on the first and second end housings;

elongated keys extending through the key-receiving slots on the first and second end housings and the keyway in the top and bottom covers, to secure the top and bottom covers onto the board assembly; and key latches for latching the keys within the keyway.

2. The PC card of claim 1 wherein the top and bottom covers further include shelves extending from the opposite sides of the covers for engaging and supporting the opposite sides of the PC board.

3. The PC card of claim 1 wherein:
the tracks on the top cover include spaced loops on the first and second opposite sides; and
the tracks on the bottom cover include spaced loops on the first and second opposite sides at interleaved positions with respect to the loops on the top cover, wherein the loops on the top cover extend between the loops on the bottom cover and form a continuous keyway when the covers are mounted to the PC board assembly.

4. The PC card of claim 1 wherein:
the top cover includes:
loops extending from the first and second opposite sides at spaced positions; and
shelves extending from the first and second opposite sides between the loops, for engaging and supporting an upper surface on the opposite sides of the PC board; and
the bottom cover includes:
loops extending from the first and second opposite sides at interleaved positions with respect to the loops on the top cover, so the loops on the top cover extend between the loops on the bottom cover to form a continuous keyway between the first and second end housings when the covers are mounted to the PC board assembly; and
shelves extending from the first and second opposite sides between the loops, for engaging and supporting a lower surface on the opposite sides of the PC board.

5. The PC card of claim 1 wherein the tracks include generally rectangular loops.

6. The PC card of claim 1 wherein the key latches include releasable key latches.

7. The PC card of claim 1 wherein:
the key-receiving slots in the first end housing extend through the opposite sides of the housing; and
the key latches include resilient clips in the key-receiving slots for engaging ends of the keys when the key are inserted through the key-receiving slots and into the keyways.

8. The PC card of claim 7 and further including apertures through the sides of the first end housing in communication with the key-receiving slots adjacent the resilient clips, for accessing to the clips to release the keys.

9. The PC card of claim 1 wherein:
the top and bottom covers include elongated tracks having "T" shaped channels forming an "H" shaped keyway; and the keys include elongated "H" shaped keys.

10. A PC card of the type including a board assembly having one or more electrical components electrically interconnected to a connector, and top and bottom covers for enclosing the board assembly, the improvement comprising:
top and bottom covers having first and second opposite sides, and including tracks extending from at least one of the sides to form a keyway extending along the side of the board assembly; and
an elongated key extending through the keyway to secure the top and bottom covers onto the board assembly.

11. The PC card of claim 10 and further including a key latch for latching the key within the keyway.

12. The PC card of claim 11 and further including a releasable key latch.

13. The PC card of claim 10 wherein the top and bottom covers further include shelves extending from at least one of the sides of the covers for engaging and supporting the side of the board assembly.

14. The PC card of claim 10 wherein:
the top cover includes spaced loops; and
the bottom cover includes spaced loops at interleaved positions with respect to the loops on the top cover, wherein the loops on the top cover extend between the loops on the bottom cover and form a continuous keyway when the covers are mounted to the board assembly.

15. The PC card of claim 10 wherein:
the top cover includes:
loops extending from the side at spaced positions; and
shelves extending from the side between the loops, for engaging and supporting an upper surface on the side of the PC board; and
the bottom cover includes:
loops extending from the side at interleaved positions with respect to the loops on the top cover, so that the loops on the top cover extend between the loops on the bottom cover to form a continuous keyway when the covers are mounted to the PC board assembly; and
shelves extending from the side between the loops, for engaging and supporting a lower surface on the side of the PC board.

16. The PC card of claim 10 and further including first and second end housings on opposite ends of the board assembly, the first and second end housings including key-receiving slots on at least one side aligned with the keyway.

17. The PC card of claim 10 wherein the top and bottom covers include elongated tracks having "T" shaped channels forming an "H" shaped keyway.

18. A PC card, comprising:
a board assembly, including:
a PC board;
one or more electrical components mounted on the PC board;
a connector mounted on the PC board and electrically interconnected to the electrical components;
a frame attached to the PC board;
top and bottom covers extending over the frame and PC board, including tracks forming one or more keyways extending along the sides of the frame;
an elongated key extending through each keyway, for securing the top and bottom covers onto the frame; and
a key latch for latching each key within the keyway.

19. The PC card of claim 18, wherein the frame includes at least one elongated side member, each side member forming a side wall of a keyway.

20. The PC card of claim 19, wherein each side member of the frame includes a key-receiving slot.

21. The PC card of claim 18, wherein the key latches include releasable key latches.

22. The PC card of claim 21, wherein:

the keys include notches in the surface of the keys; and the key latches include resilient spring retainers in the keyways which engage the notches in the surfaces of the keys.

23. The PC card of claim 18, wherein the frame includes a pair of elongated side members and one or more cross members extending between the side members, the side members including an exterior surface forming sidewalls of the keyways.

24. The PC card of claim 23, wherein the exterior surfaces of the frame side members include key-receiving slots.

25. The PC card of claim 24, wherein the covers include "L"-shaped tracks forming "C"-shaped keyways.

26. The PC card of claim 18, wherein the covers include "L"-shaped tracks forming "C"-shaped keyways.

* * * * *